United States Patent [19]

Kukulka

[11] Patent Number: 5,616,185
[45] Date of Patent: Apr. 1, 1997

[54] SOLAR CELL WITH INTEGRATED BYPASS DIODE AND METHOD

[75] Inventor: Jerry R. Kukulka, Santa Clarita, Calif.

[73] Assignee: Hughes Aircraft Company, Los Angeles, Calif.

[21] Appl. No.: 541,752

[22] Filed: Oct. 10, 1995

[51] Int. Cl.⁶ .............................. H01L 31/05; H01L 31/18
[52] U.S. Cl. ........................ 136/244; 136/256; 438/59; 438/66
[58] Field of Search ................... 136/244, 255–256; 437/2–5

[56] References Cited

U.S. PATENT DOCUMENTS

| | | | |
|---|---|---|---|
| 4,481,378 | 11/1984 | Lesk | 136/244 |
| 4,567,316 | 1/1986 | Hollaus et al. | 136/246 |
| 4,577,051 | 3/1986 | Hartman | 136/244 |
| 4,759,803 | 7/1988 | Cohen | 136/244 |
| 5,330,583 | 7/1994 | Asai et al. | 136/251 |

FOREIGN PATENT DOCUMENTS

| | | | |
|---|---|---|---|
| 57-122580 | 7/1982 | Japan | 136/244 |
| 58-56368 | 4/1983 | Japan | 136/244 |
| 2-298080 | 12/1990 | Japan | 136/244 |

OTHER PUBLICATIONS

Rauschenbach, H. S.; "Solar Cell Array Design Handbook"; Van Nostrand Reinhold Co. pp. 300–302.

*Primary Examiner*—Aaron Weisstuch
*Attorney, Agent, or Firm*—Elizabeth E. Leitereg; Terge Gudmestad; Wanda K. Denson-Low

[57] ABSTRACT

An integrated solar cell-bypass diode assembly is provided by forming at least one recess in the back (non-illuminated) side of the solar cell and placing at least one discrete low-profile bypass diode in respective recesses so that each bypass diode is approximately flush with the back side of the solar cell. Each bypass diode is bonded to the solar cell for anti-parallel connection across the solar cell. The back side of the solar cell is preferably formed with a honeycomb pattern of recesses to reduce the weight of the solar cell while maintaining mechanical strength. The recesses that receive bypass diodes preferably have a rectangular shape that better accommodates the bypass diode.

14 Claims, 3 Drawing Sheets

SOLAR CELL WITH INTEGRATED BYPASS DIODE AND METHOD

BACKGROUND OF THE INVENTION

1. Field of the Invention

The present invention generally relates to solar cells, and more specifically to a solar cell assembly that includes a bypass diode that is positioned in a recess on the backside of a solar cell for anti-parallel connection with the solar cell.

2. Description of the Related Art

Arrays which may include hundreds or thousands of solar cells bonded to a solar panel are used to provide electrical power for a variety of applications such as spacecraft. In most applications in which solar cells are used, size and weight considerations are very important. A solar cell includes a flat photovoltaic wafer made from n-type or p-type crystalline semiconductor material, such as silicon, gallium arsenide or germanium, in or on which a thin surface layer of the opposite conductivity type is formed. The interface between the surface layer and the main or bulk region of the wafer defines a semiconductor junction. A current collector grid metallization is formed on the surface layer and a metal layer is formed on the back surface of the wafer. Illumination of the surface layer causes a liberation of charge carriers, including electrons and holes in the region of the semiconductor junction, which migrate toward opposite surfaces to establish a potential across the solar cell.

Solar cells are typically modeled as diodes that respond to illumination by becoming forward biased and establishing a voltage across the cell. A silicon solar cell produces about 0.6V, while a gallium arsenide cell produces about 1.0V. A relatively new class of multijunction solar cells, formed from a combination of group III and group V materials and commonly referred to as Advanced "III–V" cells, produce a somewhat higher forward voltage. When the solar cell is in a circuit and is not illuminated, the current flow through the cell becomes limited, which causes the cell to become reverse biased. If the reverse bias voltage is high enough the solar cell may break down and become permanently damaged. Silicon cells have a typical breakdown voltage of approximately 60V with a minimum of approximately 35V. Gallium arsenide cells have a much lower breakdown voltage, nominally 5V and as low as 1V, and hence are more susceptible to damage. The Advanced "III–V" cells can break down at even lower voltages.

The solar cells may be connected in series strings to provide a desired voltage, in parallel to provide a desired current, or in a series-parallel combination. When all of the solar cells are illuminated, they each produce their respective voltage or current outputs which sum together to maintain the desired overall output. However, if one or more of the solar cells becomes shadowed those cells become reverse biased. For example, in a spacecraft an antenna may cast a shadow across the array.

The effect of shadowing a solar cell in a series string depends upon the specific characteristics of the cell. If the cell has a very low reverse current, reverse biasing the cell will effectively force the string output to zero. Conversely, if the cell breaks down at a relatively low reverse voltage, the effect of shadowing a cell on the string output is reduced. However, the cell can be permanently damaged.

Bypass diodes, typically of silicon, are used to minimize output losses and to protect cells when they become shadowed. Bypass diodes can be connected across single cells, across strings of cells, or across rows of parallel-connected cells. As shown in FIG. 1, the bypass diode 10 and solar cells 12 are connected in an anti-parallel configuration such that the bypass diode is reverse biased when the solar cells are illuminated. Bypass diodes that have very low reverse currents are preferred to avoid reducing current in the solar cell during normal operation, which would reduce power efficiency. When the cell becomes shadowed, the current flow through the cell is limited, causing the cell to become reverse biased. This causes the bypass diode to become forward biased and conduct so that the current in the string can continue to flow. The bypass diode also limits the reverse bias voltage across the cell so that it does not break down and become permanently damaged. The voltage output $V_{out}$ of the string of cells is reduced by the voltage that would be produced by the non-illuminated cells and the voltage drop across the bypass diode.

The "Solar Cell Array Design Handbook," by H. S. Rauschenbach, Van Nostrand Reinhold Co., pp. 300–302 (1980) discloses three types of bypass diodes: conventional rectifier diodes, rectifier wafers and integral diodes. The conventional rectifier diodes are wire bonded to the solar panel adjacent the solar cells. In strings of silicon cells, one bypass diode per every seventy cells is sufficient to limit the maximum reverse voltage to be less than 35V so that the cells do not break down. The additional space on the solar panel, weight, time, and cost of installing one diode per seventy cells is not significant. However, in strings of gallium arsenide cells, one bypass diode per cell would be required to ensure protection. Instead, typically one diode per five cells is used and the cells are screened to remove those cells that break down at less than 5V. This typically results in a loss of between 10% and 30% of the cells. Furthermore, wire bonding the diodes to the surface of the solar panel generally increases the overall size, and thus weight, of the panel by approximately 15%.

In Rauschenbach, rectifier wafers are used to protect solar cells in densely packed arrays in order to conserve space. The rectifier wafers are placed underneath the solar cells but are not directly attached to the cells. Solar cells are bonded to the solar panel along an adhesive bond line that is typically 0.004 inches thick. The placement of the wafers between the solar cells and the panel necessitates the use of a thicker bond line. This increases the cost of manufacture, substantially increases the weight of the solar panel, and may weaken the mechanical connection between the solar cells and panel.

Rauschenbach discloses that a significant improvement over the flat wafers can potentially be achieved by using solar cells with integral diodes. An integral diode is formed by fabricating the diode into the solar cell itself. This can be accomplished for silicon solar cells but is very difficult for gallium arsenide cells. Furthermore, integral diodes are characterized by a significant reverse current that tends to degrade solar cell performance.

SUMMARY OF THE INVENTION

The present invention seeks to provide a compact lightweight solar cell-bypass diode assembly that has high mechanical strength and low reverse current.

This is accomplished by forming at least one recess in the back (non-illuminated) side of the solar cell and placing at least one discrete low-profile bypass diode in respective recesses so that each bypass diode is approximately flush with the back side of the solar cell. Each bypass diode is bonded to the solar cell for anti-parallel connection across the solar cell.

In the preferred embodiment, the back side of the solar cell is formed with a honeycomb pattern of recesses to reduce the weight of the solar cell while maintaining mechanical strength. The recesses that receive bypass diodes are preferably modified to have a rectangular shape that better accommodates the bypass diodes.

For a better understanding of the invention, and to show how the same may be carried into effect, reference will now be made, by way of example, to the accompanying drawings.

DETAILED DESCRIPTION OF THE INVENTION

The present invention provides a solar cell-bypass diode assembly in which a discrete bypass diode is positioned in a recess formed in the back surface of the solar cell and is bonded to the solar cell. The solar cell-by-pass diode assembly requires less space than conventional rectifier diodes, provides a better mechanical bond to the solar panel than the rectifier wafers, and has lower reverse current than the integral diode. Redundant bypass protection can be provided by forming more than one recess on the back side of each solar cell, placing a bypass diode in each recess, and connecting each of them in anti-parallel with the solar cell. Furthermore, the electrical connections between series connected solar cells and the bypass diode electrical connections can be made simultaneously, thereby improving the electrical and mechanical quality of the connection.

Figure 2:
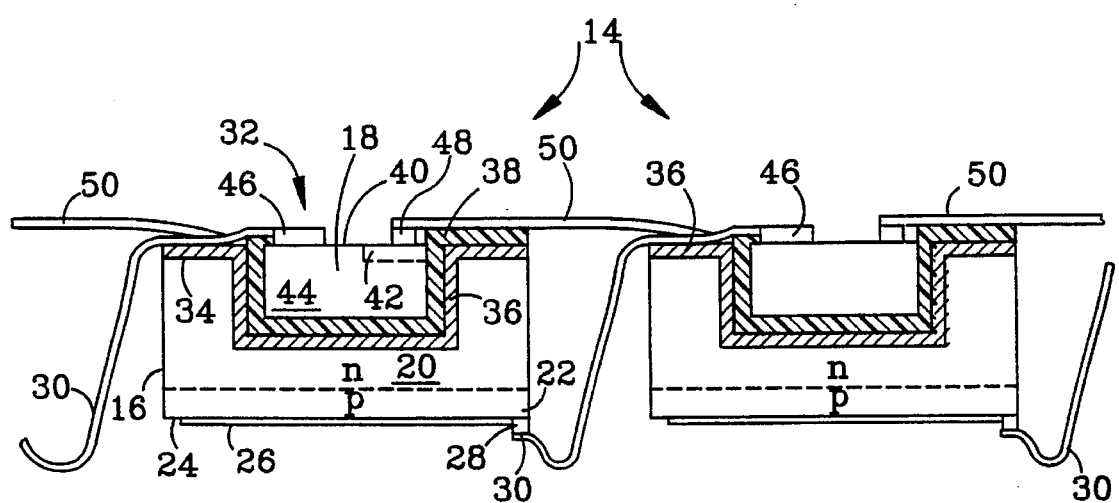
FIG. 2 is a simplified sectional view of a plurality of solar cells and respective planar isolated bypass diodes that are formed in recesses on the back surfaces of the solar cells in accordance with the present invention.

FIG. 2 is a simplified cross-sectional view of a series string of solar cell assemblies 14 that each include a solar cell 16 and at least one discrete bypass diode 18. As shown, solar cell 16 is an n-type germanium (Ge) wafer 20, suitably having a thickness of 0.007 inches (178μ) and a cross-sectional area of 2.54 cm×5.08 cm. Alternately, the wafer could be p-type Ge, p or n-type silicon, or a III–V multi-junction material. A thin, suitably 10μ or less, p-type layer 22 is formed on the solar cell's front surface 24 by means of a metallo organic chemical vapor deposition (MOCVD) procedure or a diffusion procedure. Conductive grid lines 26 formed on the front surface 24 of solar cell 16 collect current and deliver it to a collector bar 28 that is connected to a flexible interconnect tab 30. The tab 30 is preferably formed from Kovar in a U-shape and provides the solar cell's p-contact (anode).

The solar cell 16 has at least one recess 32 formed in its back surface 34. The recess 32 is preferably formed by etching the back surface 34 of the solar cell through a mask either by microblasting or conventional photolithography. The recess 32 has a depth of approximately 0.004 inches (100μ) and a rectangular cross sectional area of approximately 0.44 cm×0.44 cm. A metalization layer 36 is preferably formed over the solar cell's back surface 34 and recess 32 after the recess has been etched, and provides the solar cell's n-contact (cathode).

Bypass diode 18 is preferably a low-profile discrete diode, suitably 0.003–0.005 inches (76.2μ–127μ) thick with a cross-sectional area of 14.4 mm$^2$ (3.8 mm on a side), that is fabricated using conventional semiconductor processing techniques. The planar isolated bypass diode 18 is bonded to the solar cell 16 inside recess 32 by a silicone adhesive layer 38 that is approximately 0.001 inches (25μ) thick. The low-profile diode's front surface 40 is preferably flush with the back surface of the solar cell, but may extend 0.001–0.002 inches (25–50μ) past the back surface. The standard bond line between the solar cell and a solar panel is 0.004 inches (100μ). Thus, the solar cell-bypass diode assembly can be bonded to the solar panel using the standard bond line. This simplifies subsequent manufacturing and improves the mechanical bond between the solar cell and panel.

The bypass diode 18 shown in FIG. 2 is a p-type silicon planar isolated diode, formed by diffusing an n-type region 42 into a p-type wafer 44 to define a pn junction at their interface. The bypass diode is formed from a semiconductor material, such as silicon, that has a turnon voltage that is less than the reverse breakdown voltage of the solar cell. The diode preferably has a very low, ideally zero, reverse current. The bypass diode's anode and cathode are provided by a p-contact 46 formed over the p-type wafer 44 and an n-contact 48 formed over the n-type region 42.

Figure 3:
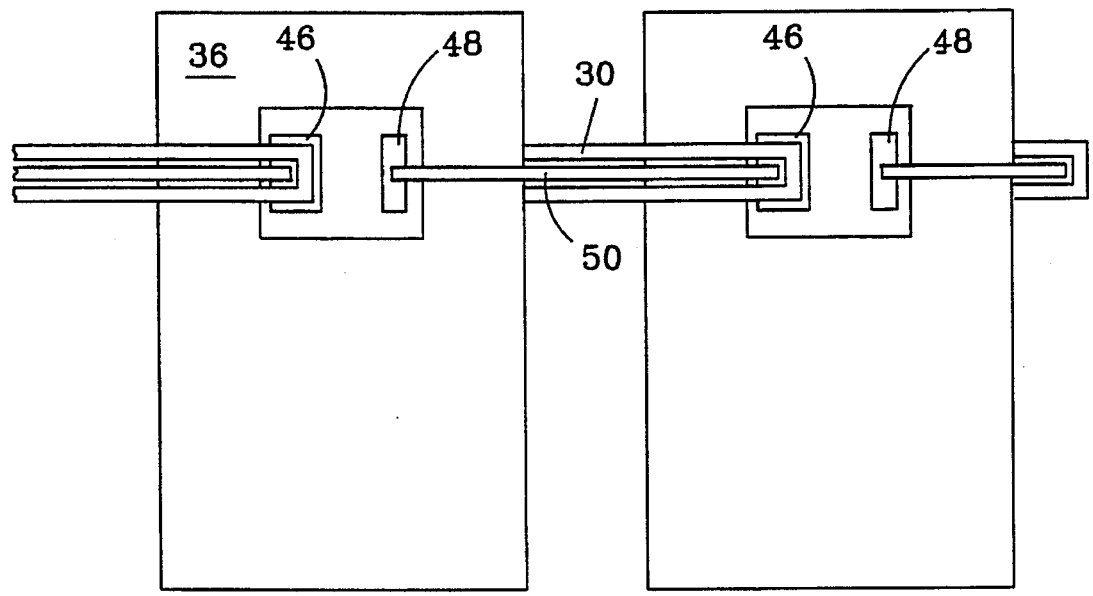
FIG. 3 is a plan view of the solar cells and bypass diodes illustrating their interconnections.

As shown in FIGS. 2 and 3, the solar cells are connected in series by bending the flexible interconnect tabs 30 (p-contacts) on the front surfaces 24 of the solar cells and contacting them to the metal layers 36 (n-contacts) on the back surfaces 34 of the adjacent solar cells. The bypass diodes are connected in anti-parallel with their associated solar cells by placing conductive interconnects 50 across the n-contact 48 on one assembly and the metal layer 36 and p-contact 46 on the next assembly. The interconnects 50 are suitably silver foil having a thickness of 0.0005 inches (12.7μ). The adhesive layer 38 also forms an insulator between the interconnect 50 and the metal layer 36 at the bypass diode's n-contact 48. The tabs 30 and interconnects 50 are simultaneously welded to the metal layer 36 and diode contacts 46 and 48. This improves the quality of the weld and reduces manufacturing costs by forming the two connections simultaneously.

Figure 1:
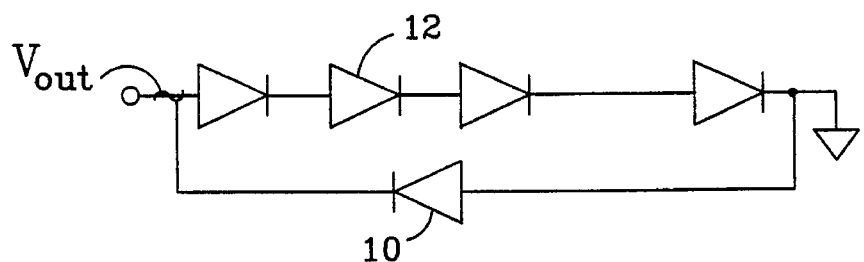
FIG. 1, described above, is a schematic diagram of a prior series string of solar cells connected in an anti-parallel configuration with a bypass diode.
Figure 4:
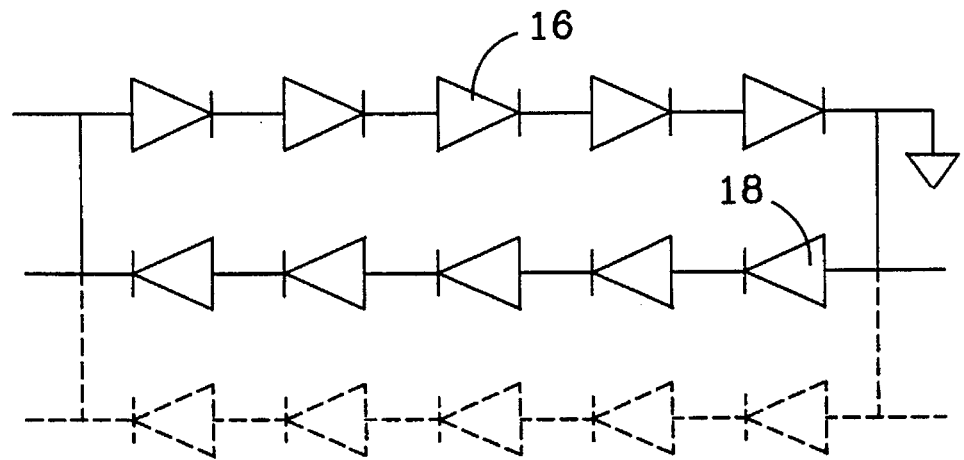
FIG. 4 is a schematic diagram of a series string of solar cells having at least one bypass diode connected across each solar cell.

As shown in FIG. 4, the solar cell-bypass diode assembly and interconnection scheme illustrated in FIGS. 2 and 3 results in at least one bypass diode 18 being connected in anti-parallel with each solar cell 16. The solar cells may be formed with multiple recesses so that more than one bypass diode can be connected in anti-parallel across the solar cell. Thus, if one bypass diode is defective or is damaged the other diodes will provide redundancy. The redundant diodes are shown with dashed lines because they may or may not be included. This is the preferred configuration because 1) it provides high break down protection for the solar cells by limiting the reverse voltage that can occur across each cell and by providing redundant bypass diodes, and 2) it is simple to connect the bypass diode across its associated solar cell. Alternately, groups of n solar cells in a string could be provided with a single bypass diode as shown in FIG. 1. This would provide less protection and would be more difficult to connect.

Figure 5:
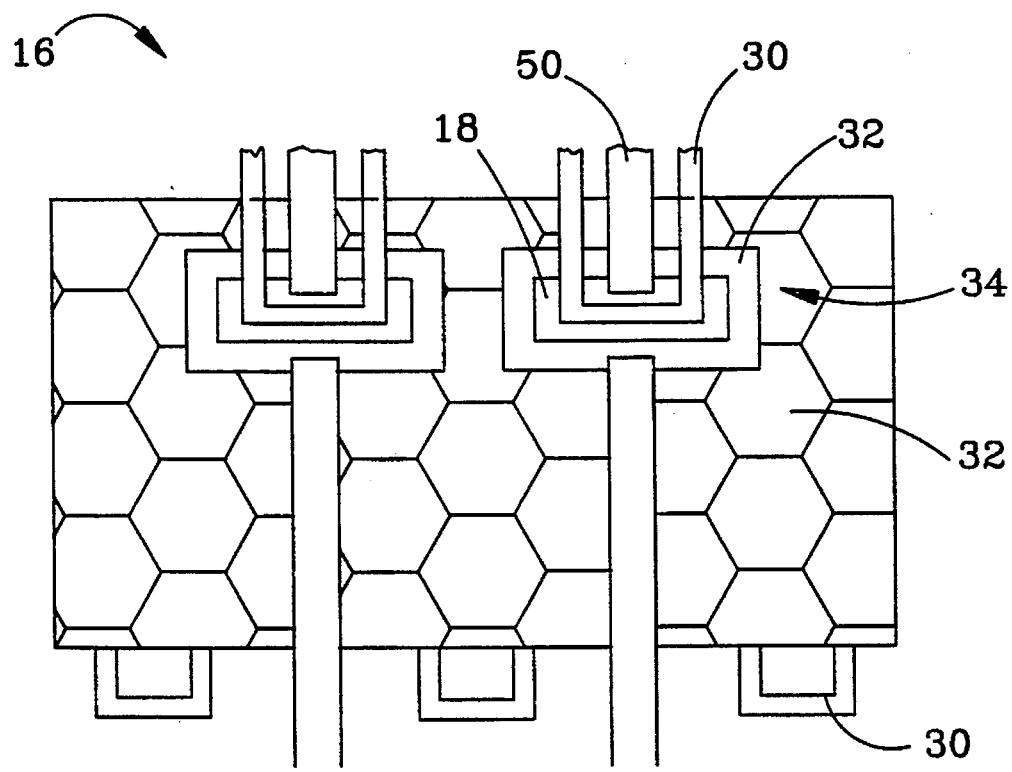
FIG. 5 is a plan view of the back surface of a preferred solar cell-bypass diode assembly.

As shown in FIG. 5, the back surface 34 of solar cell 16 is preferably formed with a generally regular pattern of recesses. U.S. Pat. No. 5,508,206 which is assigned to Spectrolab, Inc. the assignee of the present invention, discloses a solar cell with a recess pattern formed on its back surface. The recess pattern is formed to reduce the weight of the solar cell while retaining its physical strength. The recesses 32 are preferably formed by microblasting the back surface 34 through a mask to etch the n-type layer. A honeycomb pattern provides a high degree of mechanical strength for the solar cell. Microblasting entails mixing a fine aluminum oxide powder with a stream of compressed gas to etch the back surface 34. Microblasting is typically used to thin and roughen silicon wafers, but can also be used to etch the recesses in accordance with the invention. In a preferred embodiment of the invention, the recesses 32 which receive bypass diodes 18 have a rectangular rather than a hexagonal shape for a better fit of the bypass diodes 18. As shown, the solar cell includes two bypass diodes, which provide redundant protection for the cell.

Figure 6:
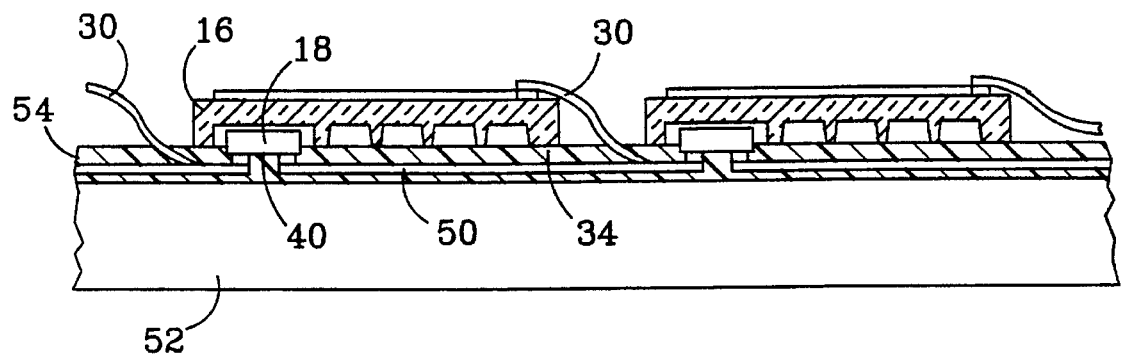
FIG. 6 is a sectional view of a plurality of solar cell-bypass diodes that are connected in a series string and bonded to a solar panel.

FIG. 6 is a sectional view of the solar cell-bypass diode assemblies 14 mounted on a solar panel 52. The back surface 34 of solar cell 16 and the front surface 40 of bypass diode 18 are bonded to the solar panel 52 with a silicone adhesive. Because the bypass diode has a low profile that extends at most approximately 0.002 inches (50.8) past the solar cell's back surface, conventional manufacturing processes can be used to provide a bond line 54 having a standard thickness of 0.004 inches (101.6μ). This improves the quality of the bond and reduces manufacturing costs.

Figure 7:
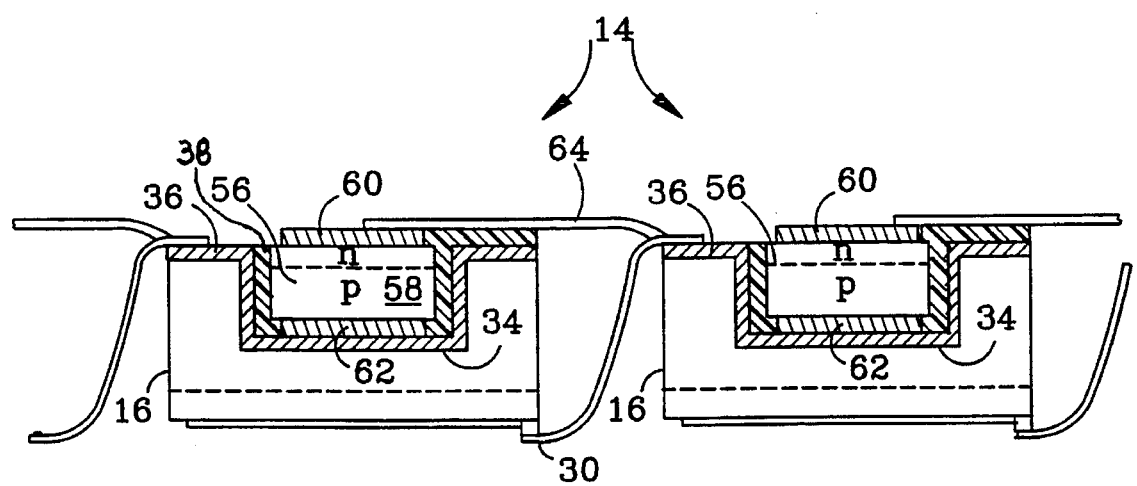
FIG. 7 is a simplified sectional view of an alternate embodiment of the solar cells in FIG. 2 with respective mesa isolated bypass diodes.

FIG. 7 shows an alternate embodiment of the invention that uses a mesa isolated bypass diode 56 in place of the planar isolation diode 18. The mesa bypass diode 56, in this example, includes a p-type silicon wafer 58 that has a thin n-type layer grown or diffused on its front surface. An n-contact 60 is formed over the n-type layer and a p-contact 62 is formed on the other side of the p-type wafer. Instead of forming separate mechanical and electrical connections between the bypass diode and the solar cell, the p-contact 62 is soldered directly to the metal layer 36 on the back surface 34 of the solar cell 16. This provides the mechanical connection between the bypass diode and solar cell and the electrical connection between the bypass diode's p-contact and the solar cell's n-contact. An interconnect 64 is still used to connect the bypass diode's n-contact 60 to the solar cell's p-contact 36.

While several illustrative embodiments of the invention have been shown and described, numerous variations and alternate embodiment will occur to those skilled in the art. Such variations and alternate embodiments are contemplated, and can be made without departing from the spirit and scope of the invention as defined in the appended claims.

I claim:

1. A solar cell assembly, comprising:

a solar cell having a front surface, a back surface, a first contact on the front surface, a second contact on the back surface, and a recess in its back surface, said solar cell producing a voltage between said first and second contacts in response to illumination of its front surface; and a discrete bypass diode that is positioned in said recess and is bonded to the solar cell, said bypass diode having third and fourth contacts adapted to be connected to said first and second contacts, respectively, in an anti-parallel configuration so that said bypass diode is reverse biased when said solar cell is illuminated and is otherwise forward biased to limit the reverse bias voltage across the solar cell and prevent it from breaking down.

2. The solar cell assembly of claim 1, wherein said bypass diode is a planar isolated diode that has a back surface bonded to the solar cell and a front surface on which said third and fourth contacts are positioned.

3. The solar cell assembly of claim 2, wherein said second contact covers the back surface of the solar cell and said bypass diode is adhesively bonded to the second contact.

4. The solar cell assembly of claim 1, wherein said bypass diode is a mesa isolated diode that has back and front surfaces on which said third and fourth contacts are positioned, respectively, said third contact being bonded to the solar cell's second contact to provide a physical and electrical interconnection.

5. The solar cell assembly of claim 1, wherein said bypass diode has a front surface that is approximately flush with the back surface of said solar cell.

6. The solar cell assembly of claim 1, wherein the back surface of the solar cell has a plurality of said recesses, said bypass diode being positioned in one of said recesses.

7. The solar cell assembly of claim 6, wherein said recess that receives said bypass diode has one shape and the remaining recesses have a different shape.

8. The solar cell assembly of claim 7, wherein said remaining recesses are hexagonal and are arranged in a honeycomb pattern.

9. The solar cell assembly of claim 1, wherein said solar cell includes a germanium wafer.

10. The solar cell assembly of claim 9, wherein said bypass diode is a silicon diode.

11. A solar panel assembly, comprising:

a panel;

a plurality of solar cells having respective back surfaces, front surfaces, first contacts on their respective front surfaces, second contacts on their respective back surfaces, and recesses in their respective back surfaces, said solar cells producing respective voltages between their first and second contacts in response to illumination of their front surfaces; and a plurality of discrete bypass diodes that are positioned in said respective recesses and are bonded to the respective solar cells, said bypass diodes having third and fourth contacts connected to said first and second contacts, respectively, in an anti-parallel configuration so that said bypass diodes are reverse biased when their respective solar cells are illuminated and are otherwise forward biased to limit the reverse bias voltage across the solar cells and prevent them from breaking down, said solar cell's back surfaces and said bypass diodes being bonded to said panel.

12. The solar panel assembly of claim 11, wherein the bond between said panel and said solar cells is formed with an adhesive layer having a predetermined thickness, said bypass diodes having front surfaces that are approximately flush with the back surfaces of their respective solar cells so that the distances from the front surfaces of the bypass diodes to the back surfaces of their respective solar cells are less than said predetermined thickness.

13. A method for forming a solar cell assembly, comprising:
 providing a solar cell having a front surface, a back surface, a first contact on the front surface, a second contact on the back surface, and a recess in its back surface, said solar cell producing a voltage between said first and second contacts in response to illumination of its front surface; and
 positioning a discrete bypass diode in said recess and bonding it to said solar cell, said bypass diode having third and fourth contacts adapted to be connected to said first and second contacts, respectively.

14. The method of claim 13, wherein providing said solar cell comprises:

providing a photovoltaic wafer of a predetermined conductivity type, said wafer having front and back surfaces;
 forming a thin layer of opposite conductivity on the front surface of the photovoltaic wafer to form a semiconductor junction;
 forming said first contact over said thin layer;
 removing a portion of said photovoltaic wafer to form said recess in its back surface; and
 forming said second contact over the wafer's back surface.

* * * * *